United States Patent
Simon et al.

(10) Patent No.: US 7,196,334 B2
(45) Date of Patent: Mar. 27, 2007

(54) X-RAY DETECTOR ELEMENT

(75) Inventors: Matthias Simon, Aachen (DE); Augusto Nascetti, Rome (IT)

(73) Assignee: Koninklijke Philips Electronics N.V., Eindhoven (NL)

( * ) Notice: Subject to any disclaimer, the term of this patent is extended or adjusted under 35 U.S.C. 154(b) by 47 days.

(21) Appl. No.: 10/554,353

(22) PCT Filed: Apr. 14, 2004

(86) PCT No.: PCT/IB2004/001215

§ 371 (c)(1),
(2), (4) Date: Oct. 24, 2005

(87) PCT Pub. No.: WO2004/095067

PCT Pub. Date: Nov. 4, 2004

(65) Prior Publication Data

US 2006/0255279 A1    Nov. 16, 2006

(30) Foreign Application Priority Data

Apr. 24, 2003    (EP)    ................................. 03101126

(51) Int. Cl.
*G01T 1/24* (2006.01)

(52) U.S. Cl. ........................... 250/370.14; 250/370.09; 250/370.11

(58) Field of Classification Search ........... 250/370.09, 250/370.11, 370.14, 580, 591, 361 R, 367; 378/98.8; 257/428, E31.086, E31.037, E31.092, 257/E31.103

See application file for complete search history.

(56) References Cited

U.S. PATENT DOCUMENTS

| | | | |
|---|---|---|---|
| 4,763,002 A | | 8/1988 | Zermeno et al. |
| 5,168,160 A | | 12/1992 | Jeromin et al. |
| 5,598,004 A | * | 1/1997 | Powell et al. ........... 250/370.09 |
| 5,698,858 A | * | 12/1997 | Borner ..................... 250/484.2 |
| 5,729,021 A | | 3/1998 | Brauers et al. |
| 5,925,890 A | * | 7/1999 | Van den Bogaert et al. ........................... 250/580 |
| 6,353,229 B1 | * | 3/2002 | Polischuk et al. ...... 250/370.14 |
| 6,359,965 B1 | | 3/2002 | Finkler et al. |
| 6,655,675 B2 | * | 12/2003 | Rutten et al. ................ 250/368 |
| 6,724,855 B2 | * | 4/2004 | Sugawara et al. ............. 378/19 |
| 6,989,539 B2 | * | 1/2006 | Wischmann et al. ... 250/370.11 |
| 2002/0014592 A1 | | 2/2002 | Rutten et al. |

(Continued)

FOREIGN PATENT DOCUMENTS

EP    0 440 282 A2    8/1991

*Primary Examiner*—David Porta
*Assistant Examiner*—Faye Boosalis

(57) ABSTRACT

The invention relates to a detector element for x-radiation, which can be used in particular in a flat dynamic x-ray detector (FDXD). In the detector element, a directly converting conversion layer (2) is arranged between an electrode layer (2) and a matrix of pixel electrodes (4), there also being a photoconductive separating layer (3) between the pixel electrodes (4) and the conversion layer (2). In the unilluminated state, the separating layer (3) acts as an electrical barrier for free charge carriers of the conversion layer (2), which have been produced by x-radiation and migrate in the electric field between the electrodes (1, 4). After readout of the charge transfers in the pixel electrodes (4), the separating layer (3) can be rendered conductive by illumination with reset light from a diode arrangement (6), so that charge accumulations at its interface can flow away. The separating layer (3) can prevent perturbing dark currents, while charge accumulation can at the same time be avoided by the repeated reset phases.

12 Claims, 1 Drawing Sheet

U.S. PATENT DOCUMENTS

2002/0079458 A1* 6/2002 Zur .................. 250/370.11
2002/0092992 A1* 7/2002 Izumi ................ 250/370.12
2006/0081785 A1* 4/2006 Heismann et al. ..... 250/370.09
2006/0192087 A1* 8/2006 Kuszpet et al. ......... 250/214 R

* cited by examiner

X-RAY DETECTOR ELEMENT

The invention relates to a detector element for x-radiation, with a directly converting conversion layer. It also relates to a flat dynamic x-ray detector and to a method for producing an x-ray image using such a detector element.

Flat dynamic x-ray detectors (FDXDs) are known, for example, from EP 440 282 A1. Such detectors can operate with indirect conversion, that is to say the x-rays are converted first into light in a scintillation layer, and then into an electrical signal in a photolayer. There are also directly converting detectors, in which absorbed x-radiation is converted directly into an electrical signal (for example, free electron-hole pairs). In these cases, the associated conversion layer typically consists of a semiconductor with a relatively large band gap. Examples are selenium, lead iodide, lead oxide, mercury iodide and cadmium-zinc telluride. The conversion layer is generally applied directly to a matrix of thin-film electronics, in which individual pixel electrodes are formed for the spatially resolved readout of the electrical signals, or the x-ray image.

One disadvantage of x-ray detectors with directly converting materials is the existence of a dark current. The dark current flows because of the non-negligible conductivity of the conversion layer when a voltage is applied to the electrodes, even though no x-radiation strikes the detector. When the detectors are also being used for dynamic imaging, perturbing residual signals can also occur after the end of the x-ray illumination; these residual signals may be caused, inter alia, by charge carriers which have been trapped during the exposure and are only released slowly.

In order to minimize the aforementioned problems, according to U.S. Pat. No. 5,729,021, the directly converting layer is doped in a particular way and additional layers are arranged on the conversion layer. The auxiliary layers have, on the one hand, the function of protecting the conversion layer from external effects and chemical reactions with the electrode materials. On the other hand, they are also intended to improve the electrical properties of the detector element, for example by preventing injection of charge carriers from the electrodes and reducing the dark current by a potential barrier. The auxiliary layers, however, also have serious disadvantages for the function of the detector element. For instance, too thick a dielectric layer has the effect that almost all of the electric field drop between the electrodes takes place across this layer, which compromises the charge separation in the x-ray-sensitive conversion layer, leading to a lower signal from the detector element. During prolonged operation of the detector element under x-ray illumination, the electrically insulating auxiliary layer can furthermore lead to charge buildup at its interface with the conversion layer, similarly as in a capacitor. This continuous charging counteracts the applied electric field and therefore also leads to a signal reduction.

Against this background, it was an object of the present invention to provide means for detecting x-radiation, which have a reduced dark current and a rapid decay characteristic with a good signal efficiency.

This object is achieved by a detector element with the features of claim 1, a flat dynamic x-ray detector with the features of claim 8, and a method with the features of claim 9. Advantageous configurations are contained in the dependent claims.

The detector element for x-radiation according to the invention contains the following components, each pair of neighboring components being connected together at their interface:

a) An electrode layer made of an electrically conductive material, for example a metal such as aluminum.
b) A conversion layer for the direct conversion of x-radiation into an electrical signal, preferably into free charge carriers in the form of electron-hole pairs.
c) A photoconductive separating layer on at least one side of the conversion layer, the electrical resistance of which can be reduced by exposing it to light (infrared, visible light, ultraviolet etc). Suitable materials for the separating layer are, for example, amorphous silicon, organic photoconductors or selenium.
d) A plurality of pixel electrodes arranged distributed in the surface, each of which has a signal memory (capacitance; generally formed by the electrode itself) and a readout circuit for controlled readout of the signal memory.
e) Illumination means for selective illumination of the photoconductive separating layer with light of a wavelength to which the separating layer is sensitive.

The sequence in which said components are arranged in the detector element reads "a-[c]-b-[c]-d-e" with the above listing convention, the square brackets [. . . ] standing for an optional arrangement and there being at least one of the layers c.

With the described detector arrangement, x-radiation can be detected by applying a voltage between the electrode layer and the pixel electrodes, and by registering the resultant flow of charge due to free charge carriers which have been produced in the conversion layer by absorbed x-radiation. The separating layer lying at the surface of the conversion layer then acts as an insulator in the unilluminated state or, in a very thin embodiment, at least as a barrier which makes it very difficult for charge carriers to pass through. This has the positive effect that perturbing dark currents, which occur even without x-irradiation of the conversion layer, are avoided. On the other hand, the conductivity of the separating layer can be selectively increased by illumination with the illumination means of the detector element, so that it loses its insulating nature. This can be utilized in order to dissipate charges from the surface of the separating layer between two x-ray exposures, so that they no longer counteract the electric field in the conversion layer. Before another x-ray exposure, the detector element can therefore be reset to a defined initial state by illuminating the photoconductive separating layer.

The photoconductive separating layer is preferably designed so that, in the absence of illumination (with electromagnetic radiation from the spectral range of visible light or ranges adjacent thereto), it forms a potential barrier for charge carriers from the conversion layer. This means that it is not entirely impossible for charge carriers from the conversion layer to flow through the separating layer to the pixel electrode, but the charge carriers must have an energy exceeding the potential barrier for this. At most a few charge carriers in the conversion layer have this energy, so that they substantially cannot migrate through the separating layer.

The (absolute) electrical resistance of the unilluminated separating layer is preferably about 5% to 80%, particularly preferably about 10% to 20%, of the (absolute) electrical resistance of the conversion layer. Said resistances are respectively measured perpendicularly to the plane of layer, so that they reflect the resistance which the charge carriers from the conversion layer experience when they migrate between the electrodes. Said order of magnitude of the electrical resistance of the separating layer ensures that the fraction of the voltage drop, between the electrode layer and the pixel electrodes, which takes place across the separating layer is not too great, so that in other words, there is still a sufficiently high electric field for the desired charge separation inside the conversion layer.

The photoconductive separating layer may be arranged between the electrode layer and the conversion layer, between the conversion layer and the pixel electrodes, or on both sides of the conversion layer. An embodiment in which the separating layer is provided between the conversion layer and the pixel electrodes is preferred. This has the advantage, inter alia, that it is "shielded" by the conversion layer from the x-radiation to be detected, but is nevertheless readily accessible for illumination taking place from the rear of the detector element.

The charges accumulated on the unilluminated separating layer, after an x-ray image has been produced, can be dissipated via the pixel electrodes and the associated readout electronics in a reset procedure by illumination of the separating layer. Optionally, however, the separating layer may also be connected to an additional electrical line, via which said charges can be collected and dissipated. The quantity of charge dissipated may, optionally, also be measured with suitable instruments and used as an indication of the total absorbed beam dose.

According to a preferred embodiment of the detector element, a light-emitting diode arrangement is provided parallel to its surface. This preferably lies on the (rear) side of the detector element facing the pixel electrodes, so that it does obstruct the x-radiation. Using a light-emitting diode arrangement, well-controllable illumination of the separating layer can be carried out in a straightforward and efficient way when its conduction characteristic needs to be modified.

As an alternative, an illumination device may also be arranged at the edge of the detector element. Depending on the embodiment of the detector element, this may offer design advantages. The refractive indices of the separating layer and of the adjoining components (conversion layer, pixel electrodes) should in this case be selected so as to obtain good propagation of light inside the separating layer, according to the principle of an optical fiber (that is to say reflection of light rays back into the separating layer).

The invention also relates to a flat dynamic x-ray detector (FDXD) which contains a detector element of the type described above. This means that the detector element has, in order, an electrode layer, a direct conversion layer with a photoconductive separating layer on one side or both sides, a plurality of pixel electrodes and illumination means for illumination of the photoconductive separating layer. The detector element may optionally be refined according to the alternative embodiments explained above.

The invention furthermore relates to a method for producing an x-ray image using a detector element of the type described above or with the flat dynamic x-ray detector FDXD explained above. The method contains the following steps:

a) Applying an electrical voltage between the electrode layer, on the one hand, and the pixel electrodes on the other hand (this means that the pixel electrodes are all at the same potential). The voltage forms an electric field between the electrode layer and the pixel electrodes, which passes through the conversion layer.

b) Projecting x-radiation to be detected into the conversion layer, while the photoconductive separating layer is simultaneously in the dark state, that is to say not illuminated with light from the spectral range to which it is sensitive. The x-radiation is converted into free charge carriers (electrons and holes) in the conversion layer, while the separating layer acts as an electrical barrier. The electric field in the conversion layer moves the free charge carriers produced there toward the electrode layer or toward the pixel electrodes, depending on their polarity. Although the charge carriers predominantly cannot reach the electrodes owing to the separating layer that acts as a barrier, a correspondingly large quantity of charge nevertheless accumulates in the signal memories of the pixel electrodes because of the displacement current.

c) Said quantity of charge in the signal memories of the pixel electrodes is then read out. During this readout, preferably, the x-irradiation is terminated or interrupted and the separating layer is in the dark state as before. The number of charges in the signal memories represents the amount of radiation absorbed in the conversion layer in the relevant region above a pixel electrode.

d) After the end of the readout process, the photoconductive separating layer is exposed to light from the spectral range to which it is sensitive, so that it enters its highly conductive state. The charges accumulated at its interface with the conversion layer can therefore flow freely inside the separating layer and be dissipated away. This dissipation may, for example, take place via the pixel electrodes. Preferably, however, the accumulated charges are dissipated via a separate line, to avoid overloading the evaluation electronics of the pixel electrodes and so that they can be dissipated as rapidly as possible. The quantity of charge dissipated may optionally be measured, since it contains an indication of the total beam dose absorbed by the detector element. By successive exposures of the separating layer, each only affecting subregions of the separating layer, the discharge may furthermore be carried out locally, separately region by region.

These and other aspects of the invention are apparent from and will be elucidated with reference to the embodiments described hereinafter.

Figure 1:
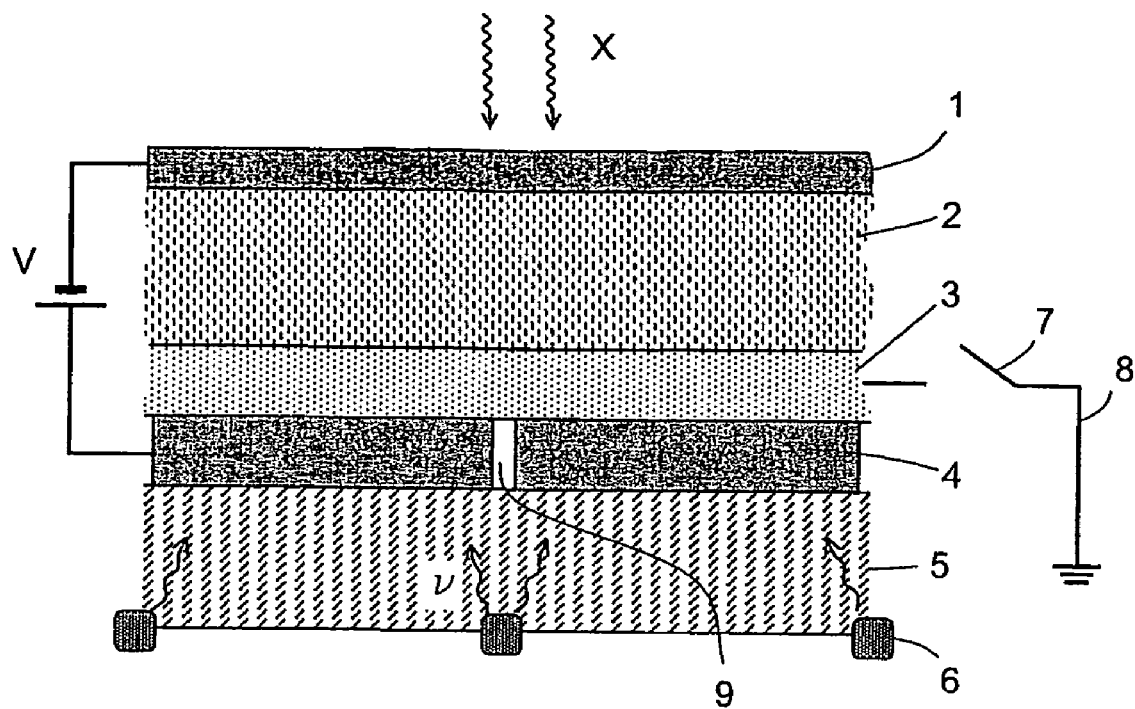
FIG. 1 shows a schematic cross section through a detector element according to the invention in the vicinity of two pixels.

FIG. 1 schematically represents in cross section the layered structure of a detector element for x-radiation according to the invention. The Figure here includes only a subsection of the order of two pixels, or pixel electrodes 4, while the overall detector element generally consists of very many more pixels (typically 2000×2000). The individual components are furthermore not shown true to scale for the sake of clarity, and, in particular, they are greatly exaggerated in the vertical direction.

The key component of the detector element is a (direct) conversion layer 2, in which incident x-ray quanta X are absorbed and converted into free electron-hole pairs. The number of free charge carriers which is generated depends on the amount of radiation absorbed.

On the upper side of the conversion layer 2, there is an electrode layer 1 made of a thin electrically conductive material, which is transparent to x-radiation. It may, for example, be a vapor-deposited metal. On the opposite lower side of the conversion layer 2, there are also matricially arranged pixel electrodes 4, the area of each pixel electrode corresponding to the size of an image point (pixel) in the x-ray image that can be produced using the detector element. At the same time, the pixel electrodes 4 form a charge memory (capacitor) and are connected to a readout circuit, via which the pixel electrode can be addressed and the charge memory can be read out. Such pixel electrodes 4 are preferably produced as thin-film electronics. The pixel electrodes 4 are arranged on a glass plate 5 which is about 1 mm thick.

Figure 2:
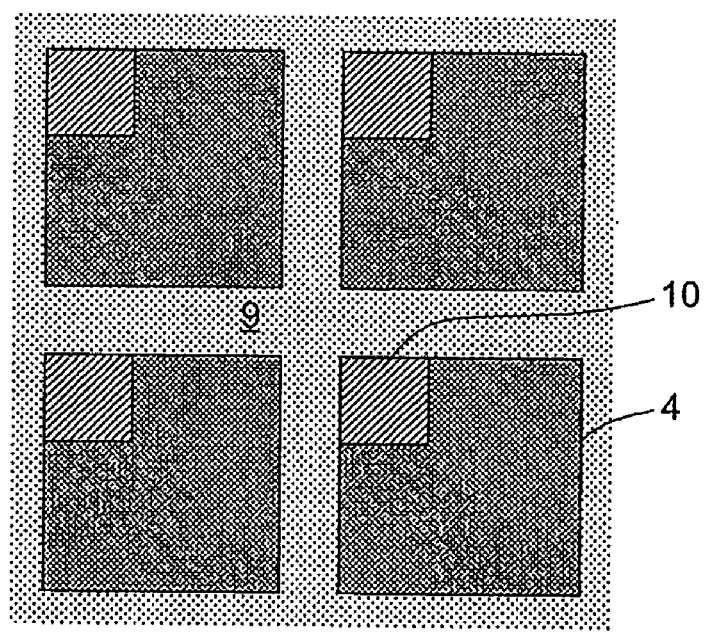
FIG. 2 shows a plan view of four pixel electrodes of the detector element in FIG. 1.

In relation to this, FIG. 2 shows a plan view of the two-dimensional distribution of the pixel electrodes 4 in a detail comprising four pixels. A readout circuit 10 (transistor) is provided inside each pixel area. A gap 9 extending as a strip in the row and column directions is left between the individual pixel electrodes 4.

For the detection of x-radiation, an electrical voltage V is applied between the electrode layer 1 and the pixel electrodes 4 (FIG. 1), which leads to the creation of an electric field perpendicular to the conversion layer 2. In this electric field, free charge carriers produced by x-ray quanta X are driven toward the corresponding electrode with opposite polarity.

In the arrangement according to the invention represented in FIG. 1, a photoconductive separating layer 3 (not previously mentioned) is arranged on the lower side of the conversion layer 2, between the conversion layer 2 and the pixel electrodes 4. As an alternative or in addition, such a photoconductive layer could also be provided between the electrode layer 1 and the conversion layer 2. The photoconductive separating layer 3 consists, for example, of amorphous silicon, an organic photoconductor and/or selenium. Its production can be readily integrated into the production process of the thin-film electronics 4. When exposed to light from the visible range or the adjacent ranges (IR, UV), the photoconductive separating layer 3 changes its behavior toward better conductivity. In other words, the unilluminated photoconductive separating layer 3 acts as an insulator or, in a correspondingly thin embodiment, at least as a barrier layer which makes it very difficult for charge carriers from the conversion layer 2 to pass through to the pixel electrodes 4. The absolute electrical resistance of the separating layer 3 (that is to say the resistance perpendicular to the separating layer 3, or between the pixel electrodes 4 and the conversion layer 2), is proportional to the electrical resistivity of the material and the layer thickness of the separating layer 3. This absolute resistance should not be so great that a large fraction of the drop of the applied voltage takes place across the separating layer 3 in the unilluminated state, so that there is still a sufficiently large electric field inside the conversion layer 2 for efficient charge transport. Nevertheless, in order to achieve a barrier effect for the charge carriers, the resistivity of the material of the separating layer 3 in the absence of illumination should be substantially more than the resistivity of the conversion layer 2. As an alternative or in addition, the work function of the separating layer 3 may also be such that it forms a potential barrier in combination with the work functions of the pixel electrodes 4 and the conversion layer 2, for the relevant charge carriers. When the photoconductive separating layer 3 is illuminated with light of the appropriate wavelength, the resistance or barrier height of the separating layer 3 should be reduced sufficiently so that charges accumulated at the interface with the conversion layer 2 can flow away rapidly. The minimum layer thickness of the separating layer 3 is dictated by the requirement for uniform coverage of the pixel electrodes 4.

In order to be able to actively change the electrical conduction properties of the separating layer 3, a light-emitting diode arrangement is provided in the embodiment according to FIG. 1. Light-emitting diodes 6 are in this case arranged in a grid, corresponding to the pixel distribution of the detector element, on the lower side of the thin-film electrodes or the glass-plate substrate 5. The intensity of the light from the light-emitting diodes must be such that enough light reaches the photoconductive separating layer 3, through the gaps 9 between the metal layers of the pixel electrodes 4, in order to significantly increase its conductivity. As an alternative to the arrangement represented in FIG. 1, the photoconductive separating layer 3 could also be illuminated from the edge. In this case, the wavelength of the light must be selected so that the light reaches all regions of the separating layer. Different refractive indices of the photoconductive separating layer 3, the conversion layer 2 and the top level of the thin-film electronics 4 should in this case cause a light-guiding effect, so that essentially only the photoconductive separating layer 3 is illuminated.

The wavelengths of the reset light delivered by the illumination device 6 must be selected with a view to the special geometrical arrangement and the materials, and may lie either in the range of visible light or in the infrared range. For exposure to visible light from below, for example, it is particularly advantageous for the pixel electrodes to consist of electrical conductors that are transparent to visible light, for example indium-tin oxide (ITO), instead of metal.

In the detector element represented in FIG. 1, the pulsed production of x-ray images takes place in the following steps, carried out in chronological succession:

1. First, the x-ray-sensitive conversion layer 2 is illuminated with x-radiation X, so that electron-hole pairs are produced and charge separation takes place in the applied electric field. The unilluminated separating layer then acts as a barrier, across which only a few charge carriers can leave the conversion layer 2. The resulting displacement current is nevertheless stored as a signal in the charge memories of the pixel electrodes 4.

2. The detector element is read out, for example row-by-row in the known way, that is to say the charges in the charge memories of the pixel electrodes 4 are registered via suitable lines and amplifiers (not shown).

3. After the x-ray exposure, charge carriers will have accumulated at the interface between the conversion layer 2 and the separating layer 3. After the readout phase, they are removed in a reset phase by rendering the photoconductive separating layer 3 conductive using a light pulse. In the example which is represented, the light pulse is produced by the light-emitting diode arrangement 6. The accumulated charges may be dissipated either through the existing pixel electronics of the pixel electrodes 4 or through the additional line 8, which can be switched by a switch 7 and is connected to the edge of the separating layer 3. In the former case, the charges flowing away are not to be employed as a signal of the individual pixel electrodes. The applied voltage between the electrode layer 1 and the pixel electrodes 4 is not altered during the reset procedure. After the reset procedure, the detector element is again ready to receive another x-ray exposure.

With the described structure of a detector element, the advantages of a directly converting detector can be exploited to the full. The additional photoconductive separating layer 3 acts, in the absence of reset light, as a barrier between the conversion layer 2 and the electrodes which greatly reduces the dark current (in the absence of x-irradiation) and no longer allows any current to flow after the x-ray illumination. The signal-to-noise ratio of the detector it is therefore greatly improved. The dynamic properties of the detector are also improved, since a lower residual signal is to be expected after the x-ray illumination. Disadvantages associated with charging of the separating layer 3 are moreover avoided, since such charging is removed by each reset procedure. The same starting situation, in which the full voltage is applied across the conversion layer 2, is therefore always encountered at the start of the x-ray pulses.

The invention claimed is:

1. A detector element for x-radiation, comprising:
   a) an electrode layer;
   b) a conversion layer for the direct conversion of x-radiation into an electrical signal,
   c) a photoconductive separating layer, which is arranged on at least one side of the conversion layer;
   d) a plurality of pixel electrodes, each with a signal memory and a readout circuit;
   e) illumination means for selective illumination of the photoconductive separating layer.

2. A detector element as claimed in claim 1, wherein in the absence of illumination, the photoconductive separating layer forms a potential barrier for charge carriers from the conversion layer.

3. A detector element as claimed in claim 1, wherein in the absence of illumination, the electrical resistance of the separating layer is about 5% to 80% of the electrical resistance of the conversion layer.

4. A detector element as claimed in claim 1, wherein the photoconductive separating layer is arranged between the pixel electrodes and the conversion layer.

5. A detector element as claimed in claim 1, wherein the photoconductive separating layer is connected to an electrical line for the controllable removal of charges.

6. A detector element as claimed in claim 1, wherein a light-emitting diode arrangement is arranged parallel to the surface of the detector element.

7. A detector element as claimed in claim 1, wherein an illumination device is arranged at the edge of the detector element.

8. A flat dynamic x-ray detector, including a detector element as claimed in claim 1.

9. A method for producing an x-ray image using a detector element as claimed in claim 1, comprising:
   a) Applying a voltage between the electrode layer and the pixel electrodes;
   b) Projecting x-radiation to be detected into the conversion layer, while the photoconductive separating layer is in the dark state;
   c) Reading out the signal memories of the pixel electrodes;
   d) Exposing the photoconductive separating layer and dissipating the charges accumulated on its surface.

10. A method as claimed in claim 9, wherein the accumulated charges are dissipated via a separate line in step b).

11. A detector element for a medical imaging apparatus comprising:
    a) an electrode layer;
    b) a conversion layer for conversion of radiation into an electrical signal,
    c) a photoconductive material disposed proximate to the conversion layer;
    d) a plurality of pixel electrodes; and
    e) illumination means for selective illumination of the photoconductive separating layer.

12. The detector element of claim 11 wherein the conductivity of the photoconductive material changes when illuminated by the illumination means.

* * * * *